US009570552B1

(12) United States Patent
Lee et al.

(10) Patent No.: US 9,570,552 B1
(45) Date of Patent: Feb. 14, 2017

(54) FORMING SYMMETRICAL STRESS LINERS FOR STRAINED CMOS VERTICAL NANOWIRE FIELD-EFFECT TRANSISTORS

(71) Applicant: GLOBALFOUNDRIES Inc., Grand Cayman (KY)

(72) Inventors: Tek Po Rinus Lee, Malta, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/076,842

(22) Filed: Mar. 22, 2016

(51) Int. Cl.
H01L 29/06 (2006.01)
H01L 29/78 (2006.01)
H01L 29/66 (2006.01)
H01L 29/10 (2006.01)
H01L 21/02 (2006.01)
H01L 21/306 (2006.01)
H01L 21/3065 (2006.01)

(52) U.S. Cl.
CPC ..... H01L 29/0676 (2013.01); H01L 21/02603 (2013.01); H01L 21/3065 (2013.01); H01L 21/30604 (2013.01); H01L 29/1054 (2013.01); H01L 29/66795 (2013.01); H01L 29/785 (2013.01); H01L 29/7842 (2013.01)

(58) Field of Classification Search
CPC ................ H01L 21/02603; H01L 21/30604; H01L 21/3065; H01L 29/0676; H01L 29/1054; H01L 29/66795; H01L 29/7842; H01L 29/785
See application file for complete search history.

(56) References Cited

U.S. PATENT DOCUMENTS

| 7,902,541 B2 | 3/2011 | Sekaric et al. | |
| 8,890,119 B2 | 11/2014 | Doyle et al. | |
| 9,196,730 B1* | 11/2015 | Yu | H01L 29/7845 |
| 2013/0175503 A1* | 7/2013 | Cohen | H01L 29/66439 257/29 |
| 2013/0264544 A1* | 10/2013 | Karg | B82Y 10/00 257/24 |
| 2013/0279145 A1* | 10/2013 | Then | H01L 29/66431 361/820 |
| 2014/0225065 A1* | 8/2014 | Rachmady | H01L 29/42392 257/24 |
| 2014/0225184 A1 | 8/2014 | Colinge et al. | |

(Continued)

*Primary Examiner* — Allan R Wilson
(74) *Attorney, Agent, or Firm* — Ditthavong & Steiner, P.C.

(57) ABSTRACT

A method of forming symmetrical stress liners to maintain strain in CMOS vertical NW FETs and the resulting device are provided. Embodiments include providing a doped semiconductor layer on an upper surface of a substrate; providing a semiconductor nanowire on the doped semiconductor layer; forming a first stress layer on the doped semiconductor layer surrounding the semiconductor nanowire; forming a gate electrode layer on a portion of the first stress layer on opposite sides of the semiconductor nanowire; forming a gate dielectric layer on the first stress layer between the gate electrode layer and the semiconductor nanowire; forming an oxide layer on a remaining portion of the first stress layer; forming a second stress layer on the oxide layer, the gate dielectric layer and the gate electrode layer; and forming contacts to the gate electrode layer, the semiconductor nanowire, and the doped semiconductor layer.

20 Claims, 24 Drawing Sheets

(56) References Cited

U.S. PATENT DOCUMENTS

2015/0137181 A1* 5/2015 Basker ............... H01L 27/0924
257/192
2016/0049472 A1* 2/2016 Yu ...................... H01L 29/0676
257/329

* cited by examiner

FORMING SYMMETRICAL STRESS LINERS FOR STRAINED CMOS VERTICAL NANOWIRE FIELD-EFFECT TRANSISTORS

TECHNICAL FIELD

The present disclosure relates to semiconductor manufacture. The present disclosure is particularly applicable to forming symmetrical stress liners in vertical nanowire field-effect transistors (NW FETs), particularly for the 5 nanometer (nm) technology node and beyond.

BACKGROUND

As the semiconductor industry continues to scale down semiconductor devices beyond 5 nm, semiconductor nanowires are being integrated as device channels to improve performance. In vertical FETs with nanowires, it is critical to at least maintain, and preferably increase, strain to enhance performance. Stress-liner induced strain has been employed for fin-type FETs (FinFETs), but device performance from stress-liner induced strain is diminishing with contacted gate pitch (CGP) scaling and the use of replacement metal gate (RMG) in FinFETs. However, CGP scaling is relaxed in a vertical device.

A need therefore exists for a methodology to introduce stress-liner induced strain for vertical FETs and the resulting device.

SUMMARY

An aspect of the present disclosure is a method for forming symmetrical stress liners for vertical NW FETs.

Another aspect of the present disclosure is a method for forming compressive liners and tensile liners for strained complementary metal-oxide semiconductor (CMOS).

Another aspect of the present disclosure is a device having symmetrical stress liners for vertical NW FETs.

Additional aspects and other features of the present disclosure is set forth in the description which follows and in part is apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a doped semiconductor layer on an upper surface of a substrate; providing a semiconductor nanowire on the doped semiconductor layer; forming a first stress layer on the doped semiconductor layer surrounding the semiconductor nanowire; forming a gate electrode layer on a portion of the first stress layer on opposite sides of the semiconductor nanowire; forming a gate dielectric layer on the first stress layer between the gate electrode layer and the semiconductor nanowire; forming an oxide layer on a remaining portion of the first stress layer; forming a second stress layer on the oxide layer, the gate dielectric layer and the gate electrode layer; and forming contacts to the gate electrode layer, the semiconductor nanowire, and the doped semiconductor layer.

Aspects of the present disclosure include forming the first stress layer by: providing a hard mask on the semiconductor nanowire; depositing the first stress layer material over the hard mask, the semiconductor nanowire, and the doped semiconductor layer; and recessing the first stress layer material to form the first stress layer. Other aspects include forming the gate dielectric layer and the gate electrode layer by: depositing a gate dielectric material on the hard mask and side surfaces of the semiconductor nanowire; depositing a gate electrode material on side and upper surfaces of the gate dielectric material and on the first stress layer; depositing a sacrificial oxide on side and upper surfaces of the gate electrode material; planarizing the gate dielectric material, the gate electrode material, and the sacrificial oxide; and removing the sacrificial oxide and etching the gate electrode material and the gate dielectric material from side surfaces of the semiconductor nanowire to form the gate dielectric layer and the gate electrode layer. Another aspect includes etching by reactive ion etching (RIE) or wet etching. Further aspects include forming the second stress layer by: depositing a second stress layer material over the oxide layer, the gate electrode layer, the gate dielectric layer, and the hard mask; planarizing the second stress layer material and hard mask; and recessing the second stress layer material to form the second stress layer. Additional aspects include depositing a sacrificial oxide over the second stress layer and the hard mask; planarizing the sacrificial oxide and hard mask; and removing the hard mask, forming a cavity, prior to forming the contacts. Another aspect includes depositing the sacrificial oxide in the cavity; and forming vias to the semiconductor nanowire, the gate electrode layer, and the doped semiconductor layer, to form drain, gate, and source contacts, respectively.

Another aspect includes a method including: providing a doped semiconductor layer on an upper surface of a substrate; providing semiconductor nanowires on the doped semiconductor layer; forming a first layer of tensile liner on a first portion of the doped semiconductor layer; forming a first layer of compressive liner on a second portion of the doped semiconductor layer; forming a gate electrode layer on a portion of the first layer of tensile liner on opposite sides of a first semiconductor nanowire and the first layer of compressive liner on opposite sides of a second semiconductor nanowire; forming a gate dielectric layer on the first layer of tensile liner and the first layer of compressive liner between the gate electrode layer and the semiconductor nanowires; forming an oxide layer on a remaining portions of the first layer of tensile liner and the first layer of compressive liner; forming a second layer of tensile liner on a first portion of the oxide layer, the gate dielectric layer and the gate electrode layer on opposite sides of the first semiconductor nanowire; forming a second layer of compressive liner on a second portion of the oxide layer, the gate dielectric layer and the gate electrode layer on opposite sides of the second semiconductor nanowire; and forming contacts to the doped semiconductor layers, the gate electrode layers, and the semiconductor nanowires.

Aspects of the present disclosure include forming the first layer of tensile liner by: providing hard masks on the semiconductor nanowires; depositing the first layer of tensile liner material over the doped semiconductor layer, the hard masks and the semiconductor nanowires; and recessing the first layer of tensile liner material to form the first layer of tensile liner. Other aspects include forming the first layer of compressive liner by: depositing a sacrificial oxide on the first layer of tensile liner and side surfaces of the hard masks and the semiconductor nanowires; forming a photoresist on a first portion of the sacrificial oxide and the hard mask; removing a portion of the sacrificial oxide and the first layer of tensile liner on the second portion of the doped semiconductor layer; depositing the first layer of compressive liner materials on the second portion of the doped semiconductor layer and on side surfaces of the remaining sacrificial oxide, the hard mask, and the semiconductor nanowires; depositing the sacrificial oxide on the first layer of compressive liner materials; and removing a portion of the sacrificial oxide on the second portion of the doped semiconductor layer and a portion of the first layer of compressive liner materials to form the first layer of compressive liner.

Further aspects include forming the gate dielectric layer and the gate electrode layer by: depositing a gate dielectric material on the hard mask, the first layer of tensile liner, the first layer of compressive liner, and side surfaces of the semiconductor nanowires; depositing a gate electrode material on side and upper surfaces of the gate dielectric material, the first layer of tensile liner and the first layer of compressive liner; depositing the sacrificial oxide on surfaces of the gate electrode material; planarizing the gate dielectric material, the gate electrode material, and the sacrificial oxide; and removing the sacrificial oxide and etching the gate electrode material and the gate dielectric material from side surfaces of the semiconductor nanowires to form the gate dielectric layer and the gate electrode layer. Additional aspects include etching by reactive ion etching (RIE) or wet etching. Another aspect includes removing sidewall portion of the gate electrode layer; and depositing and recessing sacrificial oxide to form an oxide layer next to the gate electrode layer in the removed sidewall portion of the gate electrode layer. Other aspects include forming the second layer of tensile liner and the second layer of compressive liner by: depositing the second layer of compressive liner material over the oxide layer, the gate electrode layer and the gate dielectric layer on opposite sides of the semiconductor nanowires, and side surfaces of the semiconductor nanowires and the hard masks; depositing the sacrificial oxide on the compressive liner material; forming a photoresist on the sacrificial oxide, the second layer of compressive liner material and the hard mask on opposite sides of the second semiconductor nanowire; removing the sacrificial oxide and the second layer of compressive liner material from the surface of the first portion of the gate dielectric, the gate electrode and the oxide layer on opposite sides of the first semiconductor nanowire; depositing the second layer of tensile liner material on the first portion of the gate dielectric, the gate electrode and the oxide layer on opposite sides of the first semiconductor nanowire; depositing the sacrificial oxide on the second layer of tensile liner material; and removing the sacrificial oxide, and recessing the second layer of tensile liner material and the second layer of compressive liner materials to form the second layer of tensile liner and the second layer of compressive liner. Further aspects include depositing the sacrificial oxide on the second layer of tensile liner and the second layer of compressive liner; and removing the hard mask, forming a cavity, prior to forming the contacts. Additional aspects include depositing the sacrificial oxide in the cavity; and forming vias to the doped semiconductor layers, the gate electrode layers, and the semiconductor nanowires to form the source, drain, and gate contacts, respectively.

A further aspect of the present disclosure is a device including: a doped semiconductor layer on an upper surface of a substrate; semiconductor nanowires on the doped semiconductor layer; a first layer of tensile liner on a first portion of the doped semiconductor layer; a gate electrode layer on a portion of the first layer of tensile liner on opposite sides of a first semiconductor nanowire; a gate dielectric layer on the first layer of tensile liner between the gate electrode layer and the first semiconductor nanowire; an oxide layer on a remaining portions of the first layer of tensile liner; a second layer of tensile liner on a first portion of the oxide layer, the gate dielectric layer and the gate electrode layer on opposite sides of the first semiconductor nanowire.

Aspects of the device include contacts to the doped semiconductor layer, the gate electrode layer, and the semiconductor nanowire. Other aspects include a first layer of compressive liner on a second portion of the doped semiconductor layer; a gate electrode layer on a portion of the first layer of compressive liner on opposite sides of a second semiconductor nanowire; a gate dielectric layer on the first layer of compressive liner between the gate electrode layer and the second semiconductor nanowire; an oxide layer on a remaining portions of the first layer of compressive liner; and a second layer of compressive liner on a second portion of the oxide layer, the gate dielectric layer and the gate electrode layer on opposite sides of the second semiconductor nanowire. A further aspect includes contacts to the doped semiconductor layers, the gate electrode layers, and the semiconductor nanowires.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1K schematically illustrate sequential steps of a method for forming two stress layers in vertical NW FETs, in accordance with an exemplary embodiment; and FIGS. 2A through 2M schematically illustrate sequential steps of a method for forming tensile liners and compressive liners in a CMOS, in accordance with an exemplary embodiment.

DETAILED DESCRIPTION

Figure 1A:
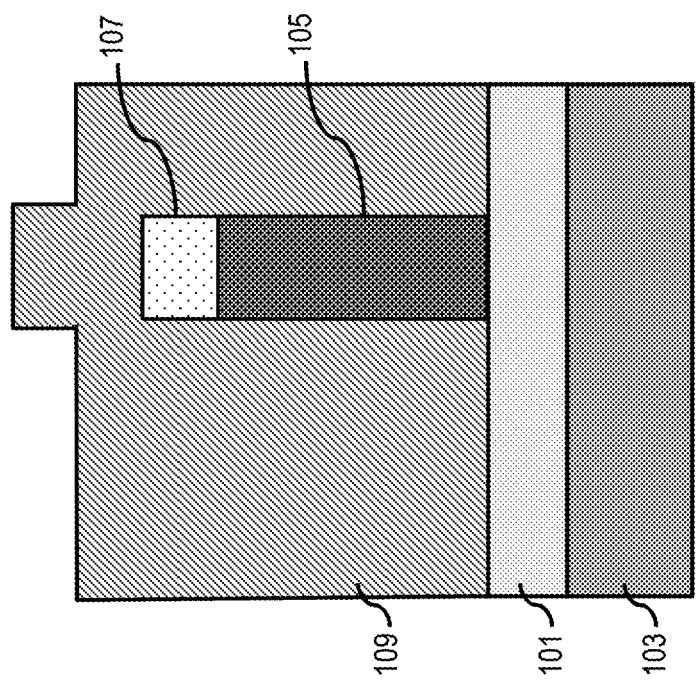

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of diminishing strains in vertical NW FETs, which in turn negatively affects device performance. A vertical NW FETs includes a semiconductor pillar with a horizontal region at the base which typically includes source/drain regions. A circumference of the pillar and a height of the pillar define a channel area within the semiconductor pillar.

The vertical FETs benefit from an offset in scaling in a vertical direction (i.e., as a pillar linewidth is scaled to a narrower linewidth dimension a pillar height may be increased to maintain a constant vertical FET channel area). In accordance with embodiments of the present disclosure, stress liners are deposited and wrapped around the source/drain regions of the vertical NW FETs to induce strain in the channel.

Methodology in accordance with embodiments of the present disclosure includes providing a semiconductor nanowire on a doped semiconductor layer on an upper surface of a substrate. Next, a first stress layer is formed on the doped semiconductor layer surrounding the semiconductor nanowire. Then, a gate electrode layer is formed on a portion of the first stress layer on opposite sides of the semiconductor nanowire. Subsequently, a gate dielectric layer is formed on the first stress layer between the gate electrode layer and the semiconductor nanowire. Thereafter, an oxide layer is formed on a remaining portion of the first stress layer. Then, a second stress layer is formed on the oxide layer, the gate dielectric layer, and the gate electrode layer. Finally, contacts to the gate electrode layer, the semiconductor nanowire, and the doped semiconductor layer are formed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1K schematically illustrate a process flow for forming two stress layers in vertical NW FETs, in accordance with an exemplary embodiment. Adverting to FIG. 1A, a doped semiconductor layer 101 is formed on an upper surface of a substrate 103 by a conventional technique, e.g., by epitaxial growth or by implantation and annealing. The doped semiconductor layer 101 may be N+ for an NFET or P+ for a PFET. The substrate 103 serves as a foundation upon which the doped semiconductor layer 101 is applied. A vertical semiconductor nanowire 105 topped with a hard mask 107 is provided on the doped semiconductor layer. The semiconductor nanowire 105 may refer to a semiconductor wire having transverse lateral and vertical dimensions of the order of a nanometer. A semiconductor nanowire enables enhanced control of the charge carriers along the length-wise direction through a complete encirclement of the cross-sectional area of the semiconductor nanowire by a gate dielectric and gate electrode. Next, a stress layer material 109 may be formed on the doped semiconductor layer 101 and the area surrounding the semiconductor nanowire 105. The stress layer material 109 may be formed by chemical vapor deposition (CVD) and/or atomic layer deposition (ALD) and variations of these deposition processes. The stress layer material 109 may be formed of SiN with tensile stress for an NFET or compressive stress for a PFET.

Figure 1B:
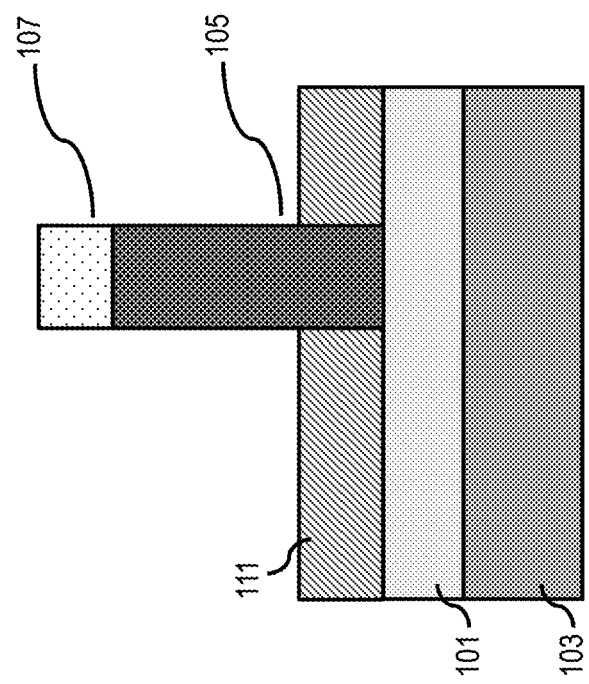

Adverting to FIG. 1B, a chemical mechanical polishing (CMP) process is performed on the stress layer material 109, with the CMP process stopping on and exposing the hard mask 107. Then, the stress layer material 109 is recessed to form stress layer 111 with a thicknesses ranging from 2 to 50 nm. The stress layer 111 may apply a tensile stress or a compressive stress to the nanowire enclosed by the stress layer in the length wise direction of the nanowire.

Figure 1C:
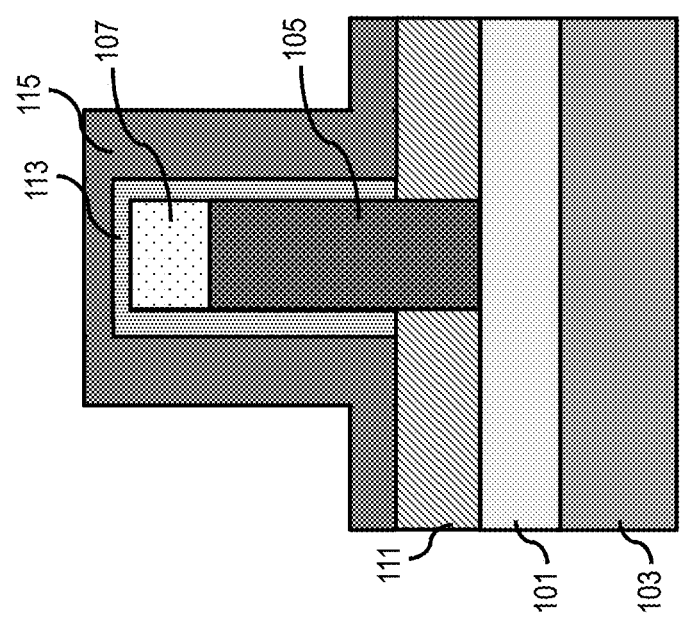

In FIG. 1C a high-K gate dielectric layer 113 (e.g., HfO$_2$, ZrO$_2$ or any high-K dielectric) is deposited to a thickness of 1 to 2 nm over the semiconductor nanowire 105 and the hard mask 107. The horizontal portion of the gate dielectric layer 113 on doped semiconductor layer 101 is etched away. Next, gate electrode layer 115 (e.g., a metal gate electrode) is deposited to a thickness of 5 to 20 nm over the gate dielectric layer 113.

Figure 1D:
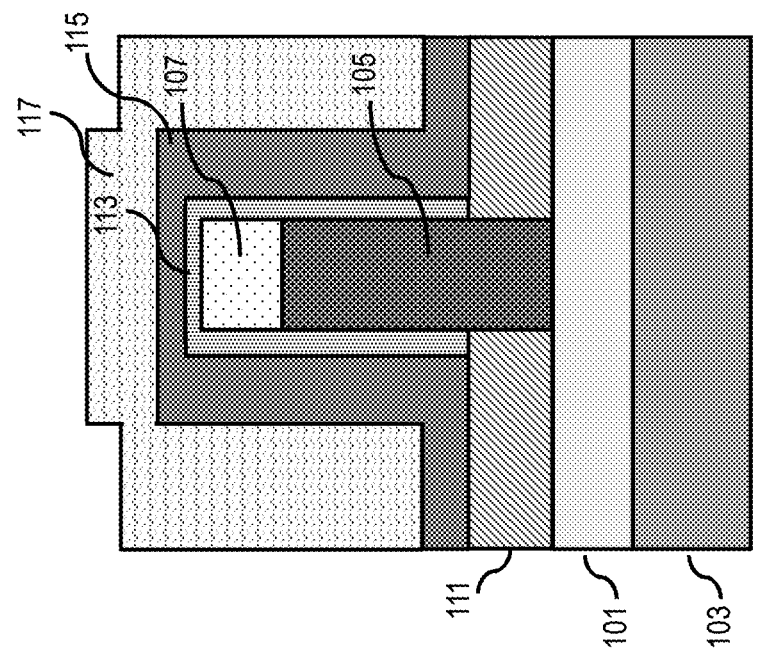

Adverting to FIG. 1D a sacrificial oxide layer 117 (e.g., SiO$_2$, TEOS) is deposited over the gate electrode layer 115. The thickness for sacrificial oxide layer 117 may range from 20 to 400 nm. The sacrificial oxide layer may be formed by a conventional oxidation process and have superior electrical and mechanical properties.

Figure 1E:
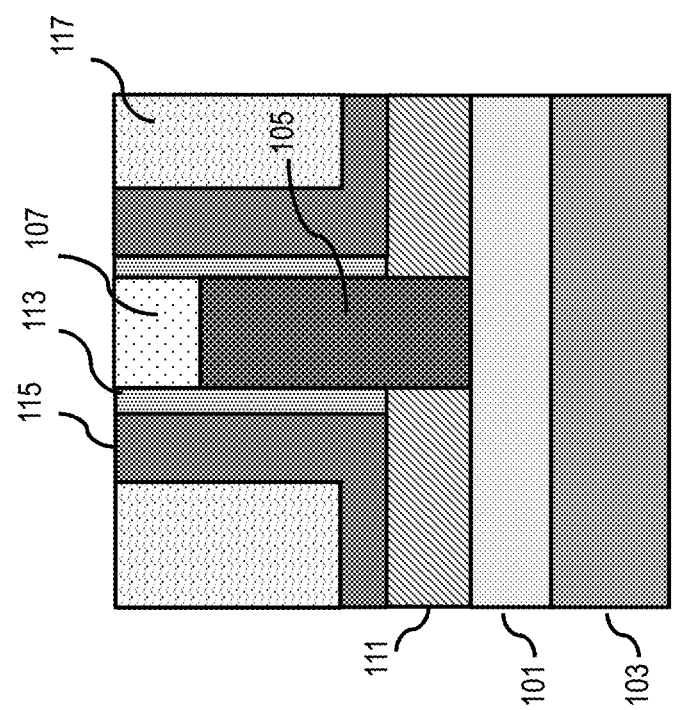
Figure 1F:
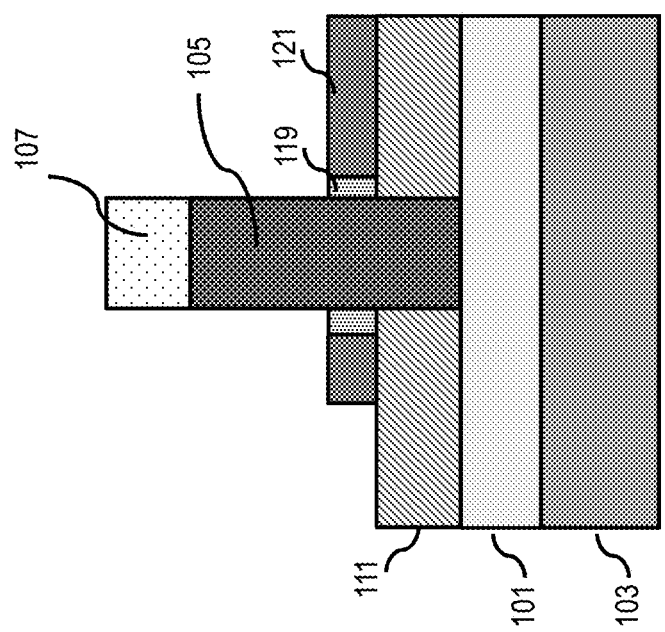

In FIG. 1E CMP is performed on the gate dielectric layer 113, the gate electrode layer 115, and the sacrificial oxide layer 117 to planarize their surfaces down to the upper surface of the hard mask 107. Adverting to FIG. 1F, the sacrificial oxide layer 117 is removed by etching. Then, etching is performed on the gate electrode layer 115 and the gate dielectric layer 113 to remove the gate dielectric and gate electrode material from sidewalls of the nanowire, forming the gate dielectric layer 119 and the gate electrode layer 121. The width of gate electrode layer 121 may be 2 to 20 nm.

Figure 1G:
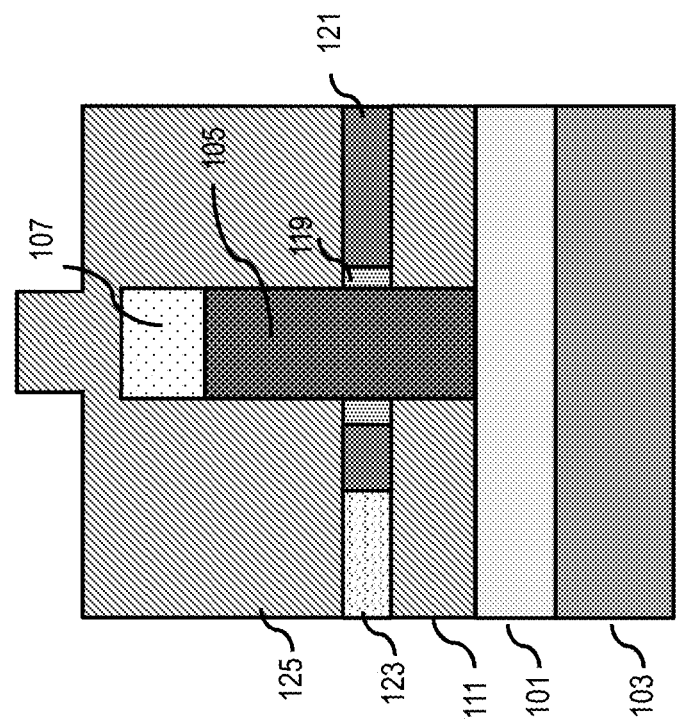
Figure 1H:
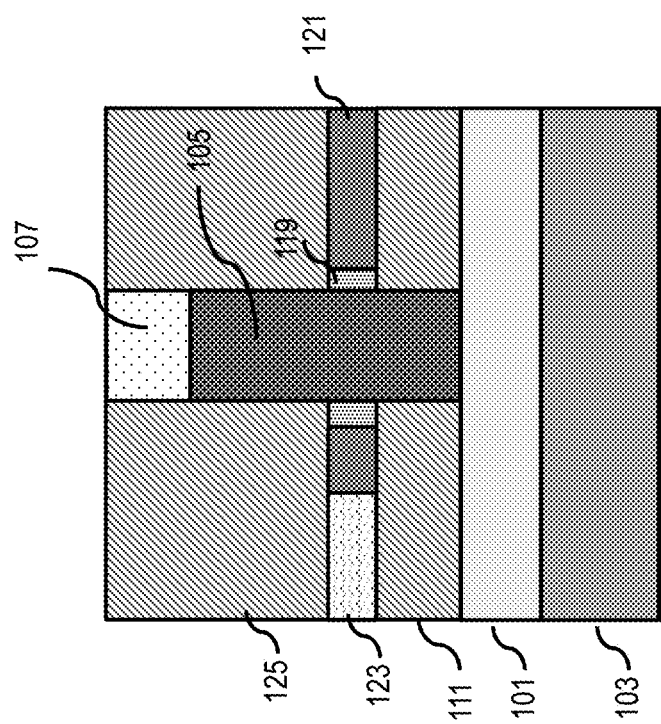
Figure 11:
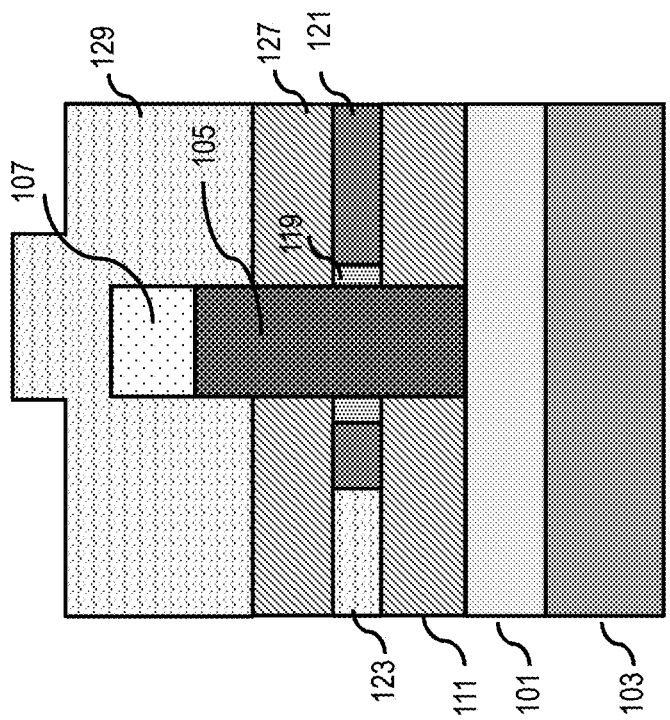

Next, as illustrated in FIG. 1G another sacrificial oxide layer is deposited over the gate dielectric layer 119 and the gate electrode layer 121 and etched to form an oxide layer 123, which is coplanar with gate electrode layer 121. The sacrificial oxide layer 123 forms a path to the doped semiconductor layer 101. Next, a stress layer material 125 is deposited over the sacrificial oxide layer 123, the gate electrode layer 121, the gate dielectric layer 119, and the hard mask 107. The stress layer material 125 may be formed by CVD and/or ALD and variations of these deposition processes. The stress layer material 125 may be formed of SiN with the same stress as stress layer 111. The stress layer material 125 is planarized by CMP, stopping on the hard mask 107, thereby exposing the upper surface of the hard mask 107, as illustrated in FIG. 1H. Subsequently, the stress layer material 125 is recessed to form the stress layer 127 having a thickness from 2 to 50 nm. Next, a sacrificial oxide layer 129 is deposited over the stress layer 127 and the hard mask 107, as illustrated in FIG. 1I.

Figure 1J:
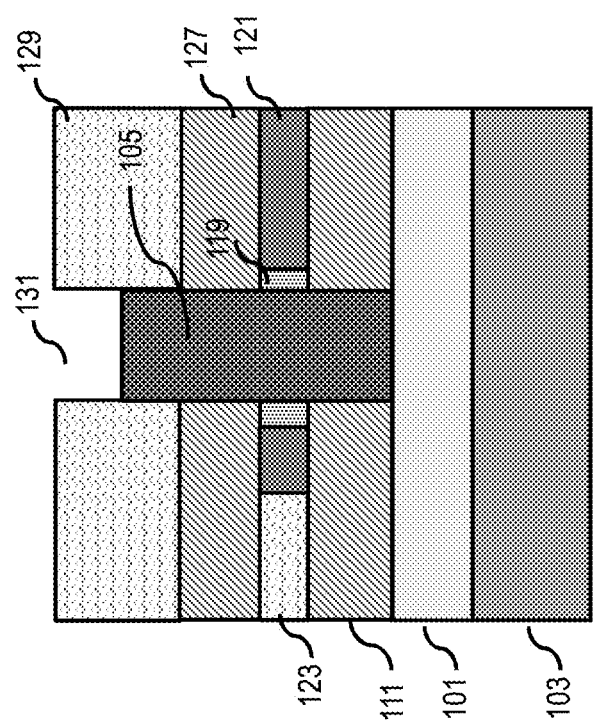
Figure 1K:
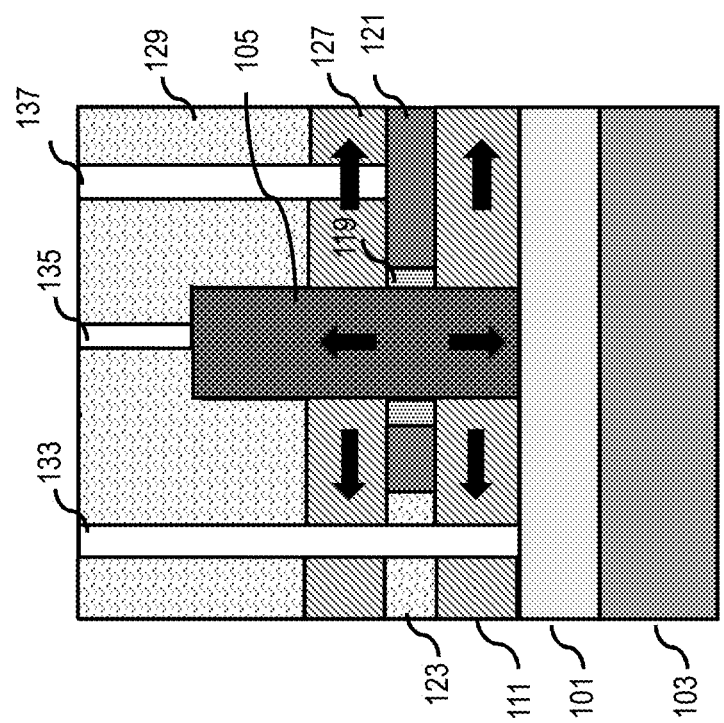

Adverting to FIG. 1J the sacrificial oxide layer 129 is planarized down to the hard mask 107 by CMP steps. Then, the hard mask 107 is removed to form a cavity 131 prior to forming the contacts. Once the SiN hard mask 107 is removed the nanowire may be doped (N+ for an NFET or P+ for a PFET). Then, sacrificial oxide is deposited in the cavity 131, as illustrated in FIG. 1K. Next, vias are formed to the semiconductor nanowire 105, the gate electrode layer 121, and the doped semiconductor layer 101, to form drain contact 135, gate contact 137, and source contact 133, respectively. The width for the source, the drain, and the gate contacts may range from 5 to 20 nm.

Figure 2A:
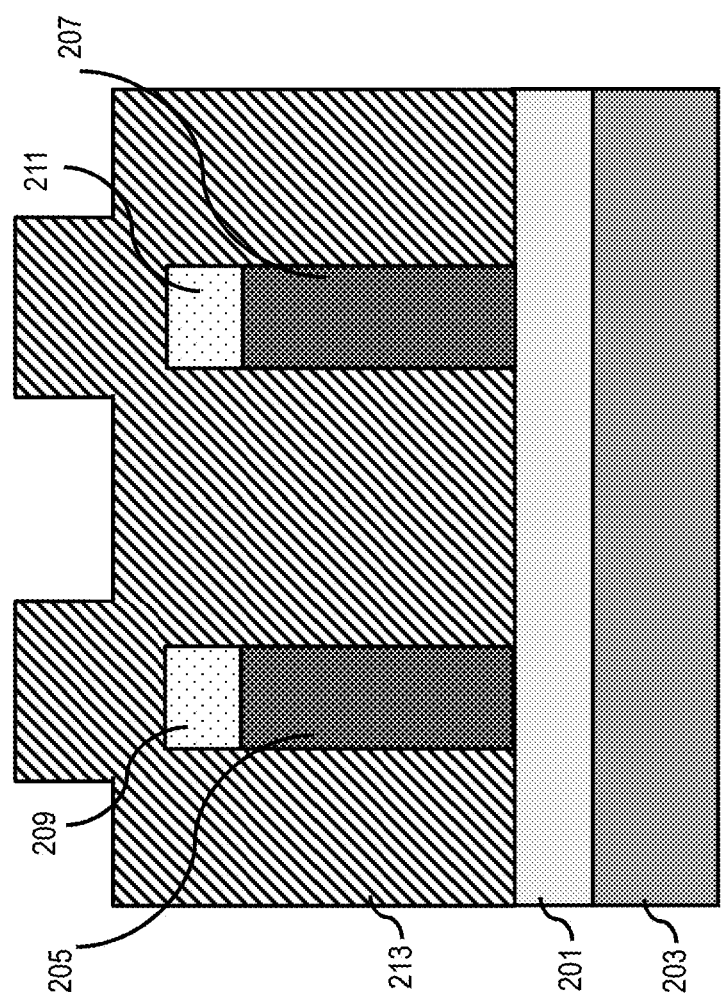

FIGS. 2A through 2M schematically illustrate sequential steps of a method for forming tensile liners and compressive liners in a CMOS, in accordance with an exemplary embodiment. In FIG. 2A a doped semiconductor layer 201 is formed on an upper surface of a substrate 203 by a conventional technique, e.g., by epitaxial growth or by implantation and annealing. The doped semiconductor layer 201 include an N+ portion for an NFET and a P+ portion for a PFET. The substrate 203 serves as a foundation upon which the doped semiconductor layer 201 is applied. Vertical semiconductor nanowires 205 and 207 topped with hard masks 209 and 211 are provided on the doped semiconductor layer 201 over the N+ and P+ portions of the doped semiconductor layer 201, respectively. Next, a tensile liner material 213 is blanket deposited on the surface of the doped semiconductor layer 201, the area surrounding the semiconductor nanowires 205 and 207, and hard masks 209 and 211.

Figure 2B:
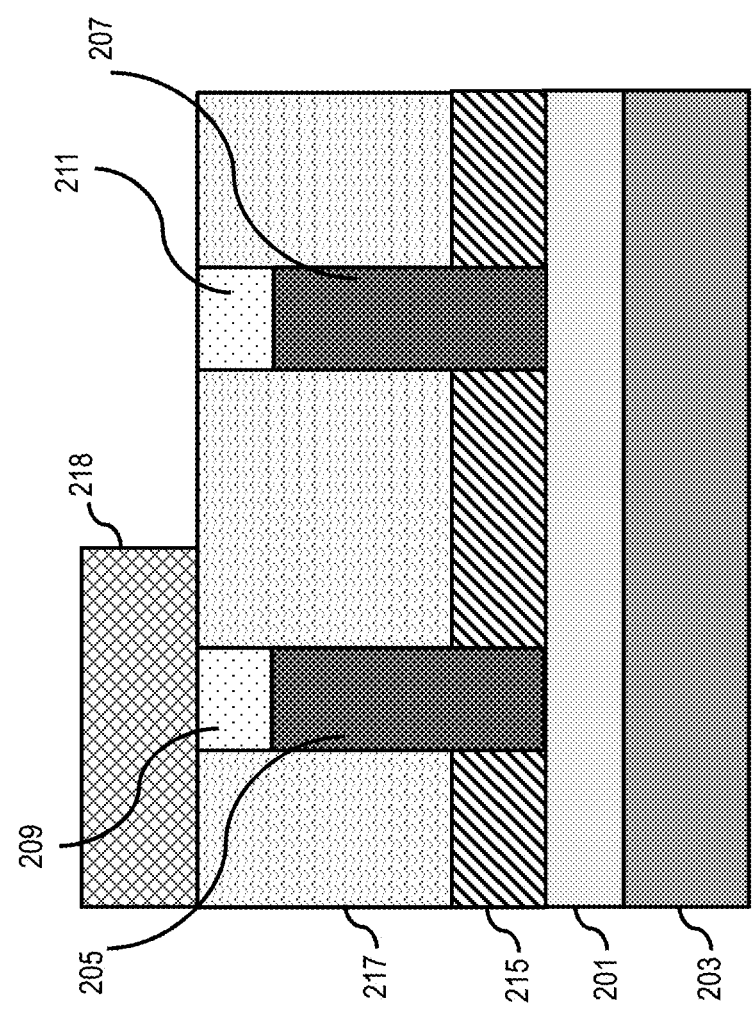

Adverting to FIG. 2B the tensile liner material 213 is recessed to form the tensile liner 215. Next, a sacrificial oxide layer 217 is deposited over the tensile liner 215 and the hard masks 209 and 211. CMP is performed on the sacrificial oxide layer 217 down to an upper surface of the hard masks 209 and 211. Then, a photoresist 218 is formed on the upper surface of the sacrificial oxide layer 217 and the hard mask 209 over the N+ portion of the doped semiconductor layer 201.

Figure 2C:
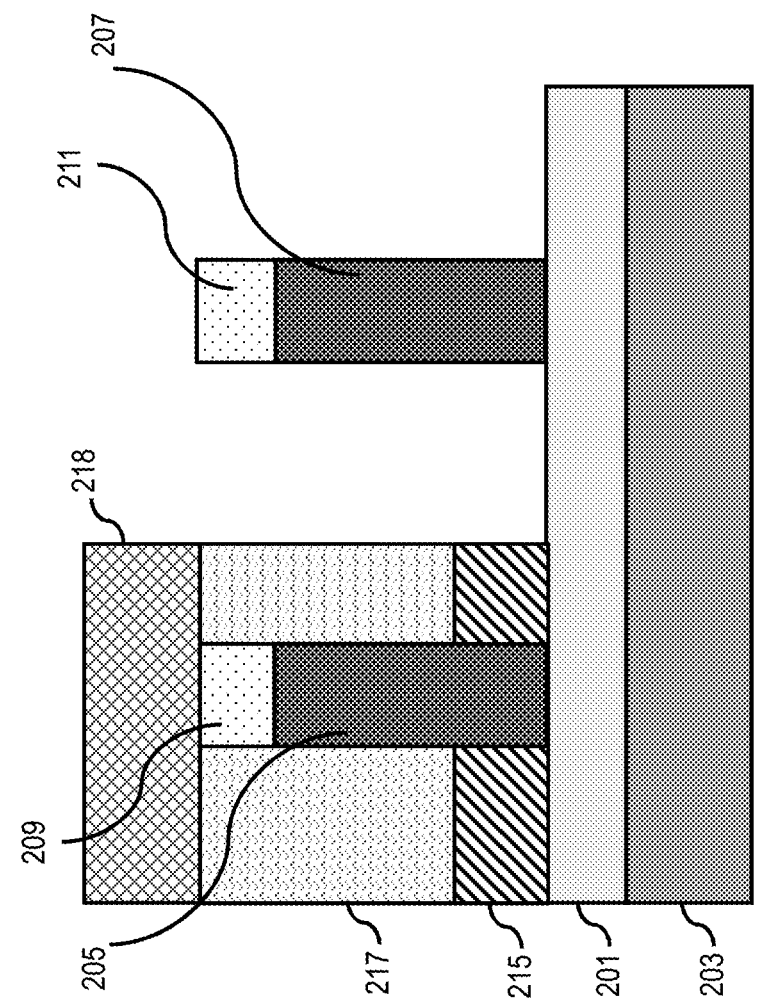
Figure 2D:
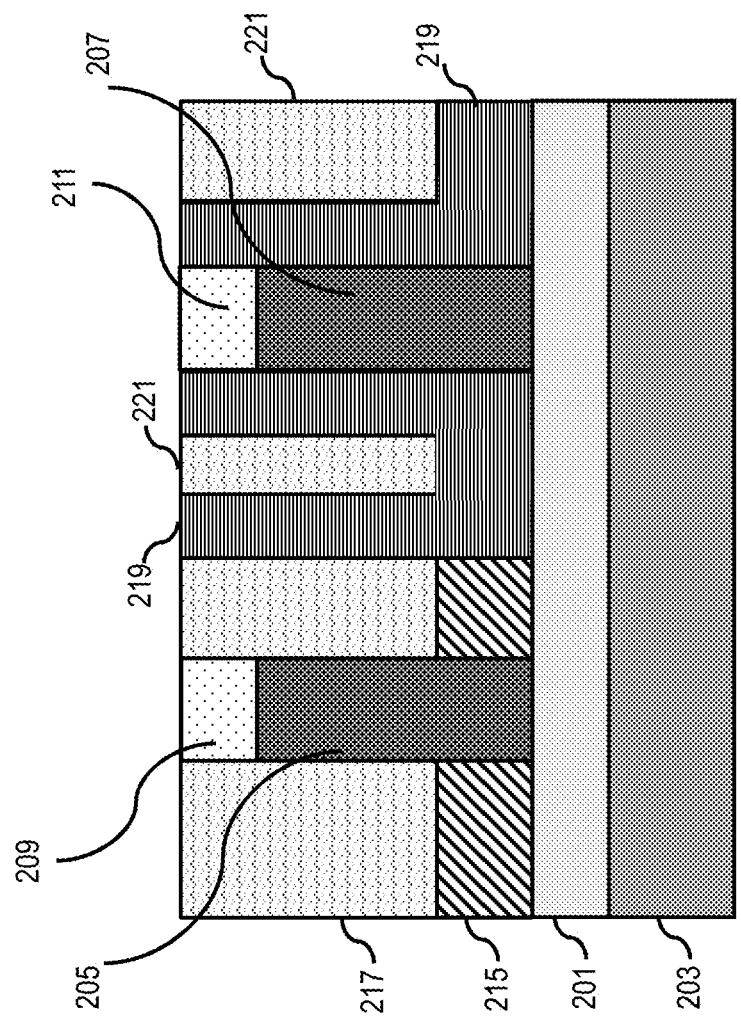

In FIG. 2C a combination of dry etching and wet etching may be performed to remove the sacrificial oxide layer 217 and the tensile liner 215 over the P+ portion of the doped semiconductor layer 201. Adverting to FIG. 2D the photoresist 218 is removed. Next, a compressive liner material 219 is deposited on the upper surface of the P+ portion of the doped semiconductor layer 201, the side surface of the tensile liner 215 and the remaining sacrificial oxide layer 217, and the side surfaces of the hard mask 211 and the semiconductor nanowire 207. The compressive liner material 219 can be compressive SiN or diamond like carbon (DLC) liners having a thickness the same as tensile liner 215, i.e. from 2 to 50 nm. Then, sacrificial oxide 221 can be deposited on the compressive liner material 219.

Figure 2E:
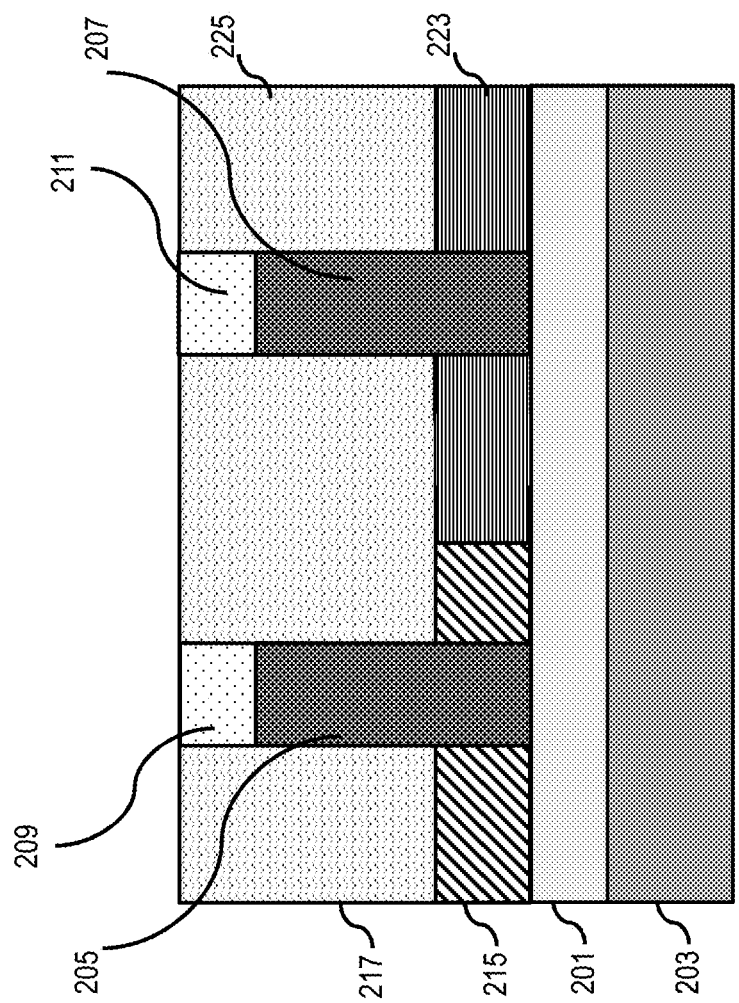

In FIG. 2E the sacrificial oxide 221 and compressive liner material 219 above an upper surface of tensile liner 215 is removed to form the compressive liner 223. A dry etch process can be employed to remove compressive liner material on the sidewalls. Next, sacrificial oxide 225 is deposited on the upper surface of the compressive liner 223, and the hard mask 211, filling all space, and CMP is performed down to an upper surface of the hard mask 211.

Figure 2F:
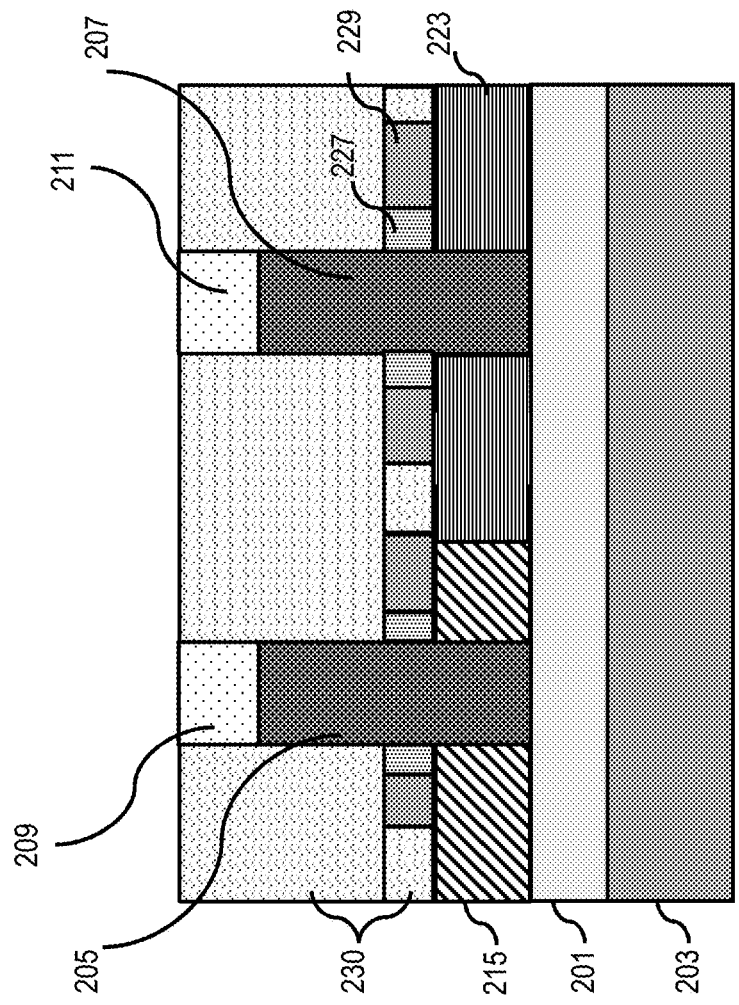

Adverting to FIG. 2F, the sacrificial oxide layer 217 and 225 is removed. Then the steps shown in FIGS. 1C through 1H are performed for both semiconductor nanowires 205 and 207. Specifically, a high-K gate dielectric layer (e.g., HfO$_2$, ZrO$_2$ or any high-K dielectric) is deposited to a thickness of 1 to 2 nm over the semiconductor nanowires 205 and 207, the hard masks 209 and 211, and the upper surface of tensile liner 215 and compressive liner 223. The horizontal portion of the gate dielectric layer 113 on the tensile and compressive liners is etched away. Next, a gate electrode layer is deposited to a thickness of 5 to 20 nm over the gate dielectric layer and over a portion of the upper surface of the tensile liner 215 and the compressive liner 223. Sacrificial oxide is deposited over the gate electrode layer, and exposed portions of the tensile liner 215 and the compressive liner 223. Subsequently, CMP is performed on the gate dielectric layer, the gate electrode layer, and the sacrificial oxide layer to planarize their surfaces down to the upper surface of the hard masks 209 and 211. Next, the sacrificial oxide is removed by etching. Then, etching is performed on the gate electrode layer and the gate dielectric layer to remove the gate dielectric and the gate electrode layers from sidewalls of the nanowires 205 and 207, forming the gate dielectric layer 227 and the gate electrode layer 229. The etching may be RIE or wet etching. After that, sacrificial oxide 230 is deposited over the gate dielectric layer 227, the gate electrode layer 229, and exposed portions of the tensile liner 215 and the compressive liner 223.

Figure 2G:
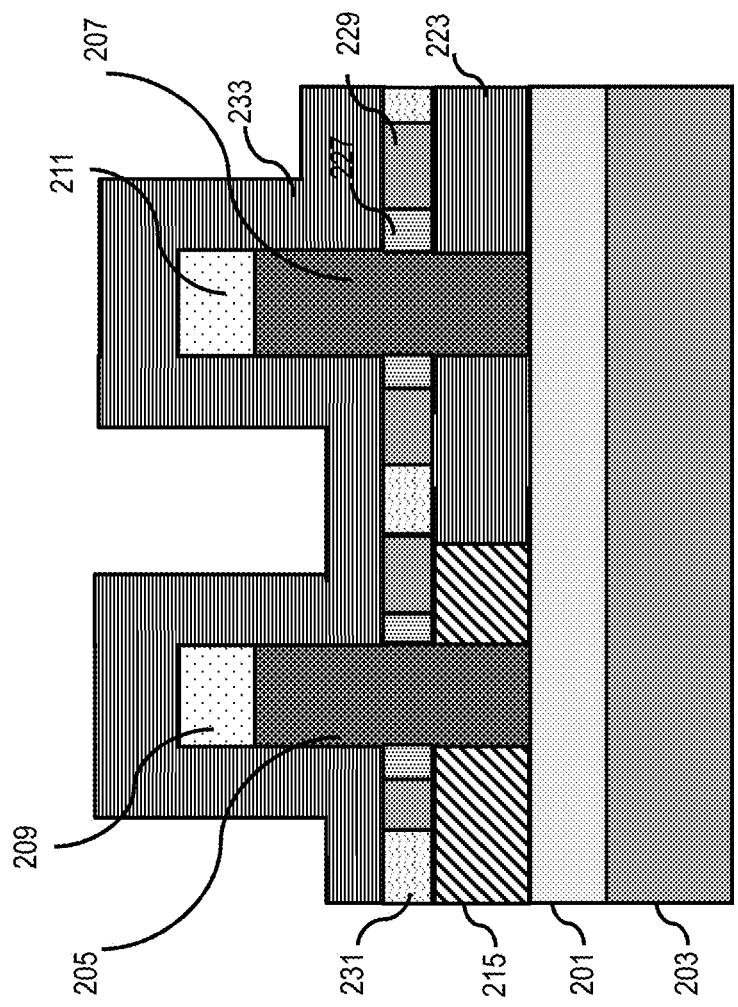

In FIG. 2G the sacrificial oxide is etched to form an oxide layer 231, which is coplanar with gate electrode layer 229. The sacrificial oxide may be etched by a combination of dry etching and wet etching. A second layer of compressive liner material 233 is deposited to a thickness of 2 to 50 nm over the oxide layer 231, the gate electrode layer 229, and the gate dielectric layer 227 on opposite sides of the semiconductor nanowires 205 and 207, on side surfaces of the semiconductor nanowires 205 and 207 and over the hard masks 209 and 211. The example material for the compressive liner material 233 can be compressive SiN or DLC liners.

Figure 2H:
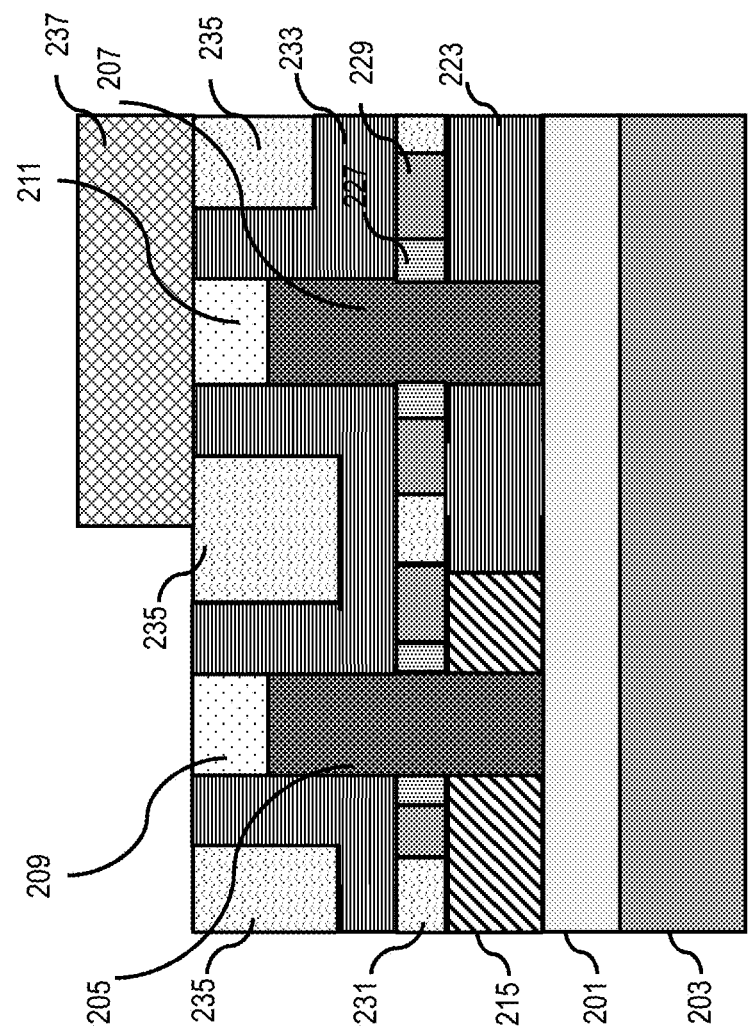
Figure 21:
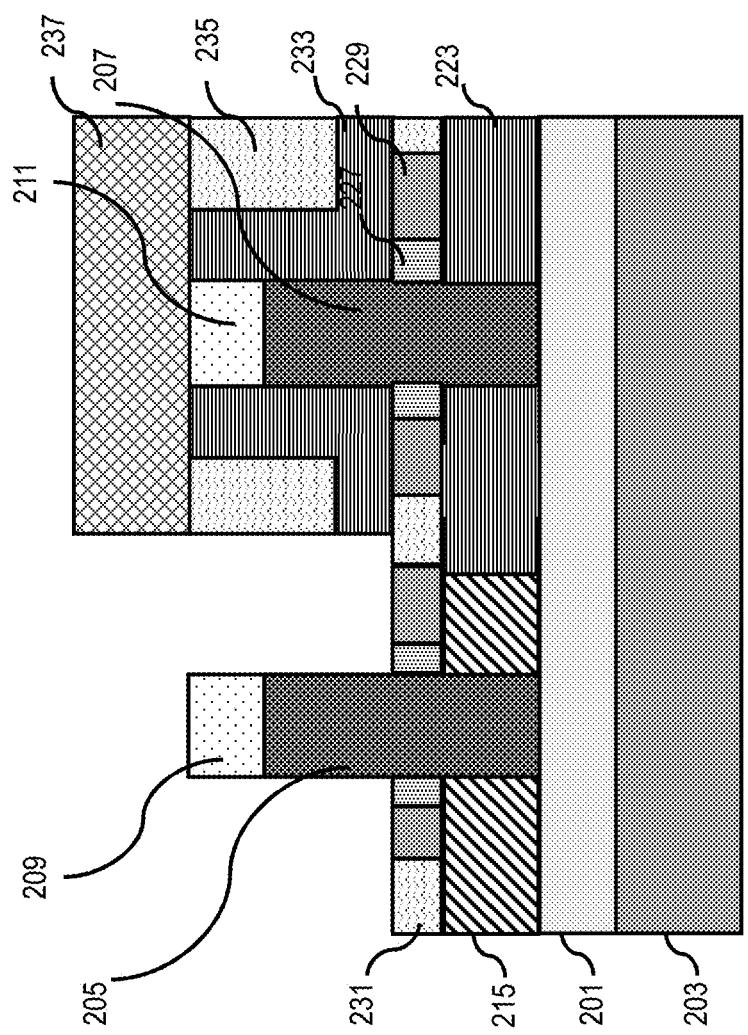
Figure 2J:
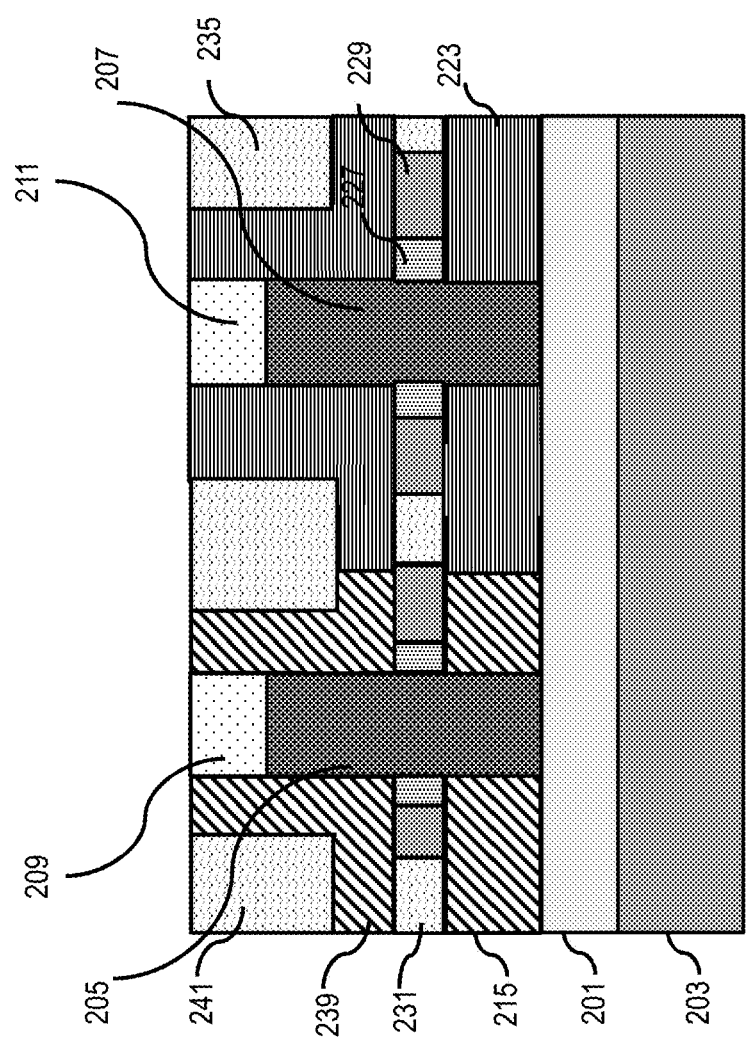

Adverting to FIG. 2H a sacrificial oxide 235 is deposited on the compressive liner material 233. Then, a photoresist 237 is formed on the upper surface of the sacrificial oxide 235 and the layer of compressive liner material 233 over the P+ portion of the doped semiconductor layer 201 and over the hard mask 211.

In FIG. 2I the exposed sacrificial oxide 235 and layer of compressive liner material 233 is removed from the upper surface of the gate dielectric layer 227, the gate electrode layer 229, and the oxide layer 231 on opposite sides of the semiconductor nanowire 205. Then, in FIG. 2J the layer of tensile liner material 239 is deposited on the surface of the gate dielectric layer 227, the gate electrode layer 229 and the oxide layer 231 and on opposite sides of the first semiconductor nanowire 205. An example of the deposition process for the tensile liner can be CVD and/or ALD and variations of these deposition processes. Next, the sacrificial oxide 241 is deposited on the layer of tensile liner material 239, CMP is performed down to the upper surface of hard mask 209, and the photoresist 237 is removed.

Figure 2K:
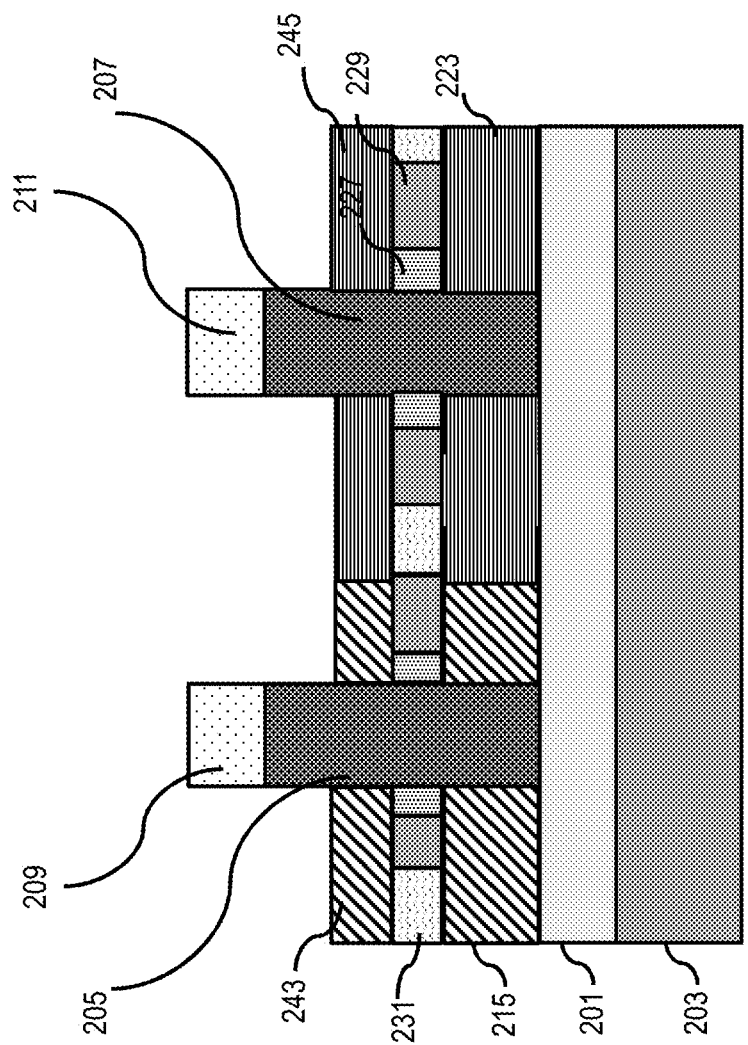
Figure 2L:
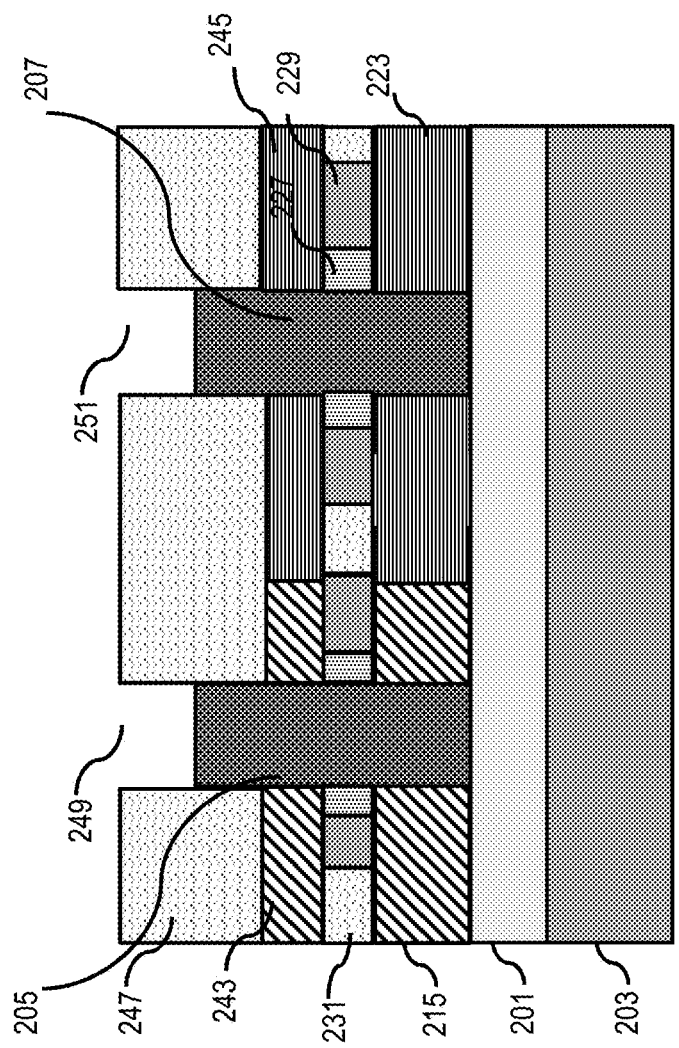

In FIG. 2K the layer of tensile liner material 239 and the layer of compressive liner material 233 are recessed to form the tensile liner 243 and the compressive liner 245, respectively, and the sacrificial oxide 241 and 235 is removed. Specifically, the tensile liner material on sidewalls of nanowire 205 is removed followed by another deposition of sacrificial oxide, to fill the space created, and CMP. Then the compressive liner material is removed from sidewalls of nanowire 207, followed by removal of the sacrificial oxide. Adverting to FIG. 2L sacrificial oxide (or an interlayer dielectric (ILD)) 247 is deposited on the tensile liner 243 and the compressive liner 245. Then, the hard masks 209 and 211 are removed to form cavities 249 and 251 prior to forming the contacts. Once the SiN hard masks 209 and 211 are removed, the nanowire may be doped (N+ for the NFET and P+ for the PFET) for source/drain doping, wherein a doping can be conventional I/I, solid-state doping via oxides, plasma doping, solution-based doping, etc. The range for the dosage can be 1 to 5 eV and 1E14 to 1E15.

Figure 2M:
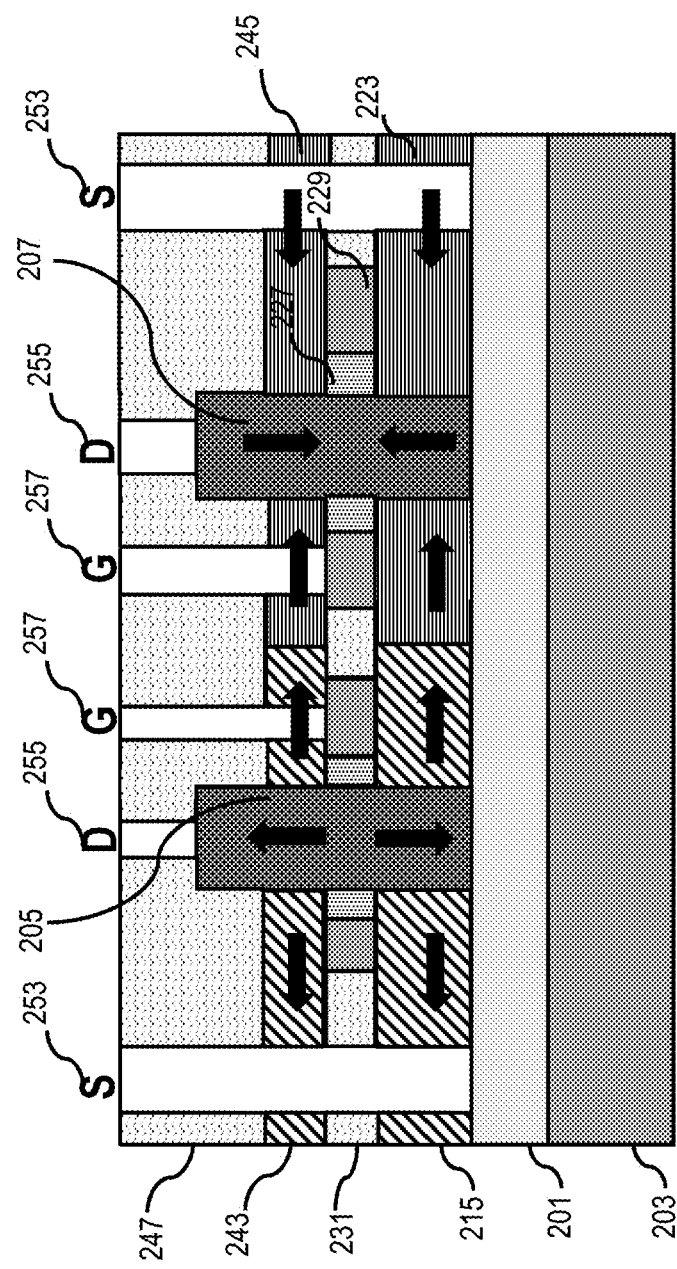

In FIG. 2M sacrificial oxide (or ILD) is deposited in the cavities 249 and 251. Then vias are formed to the doped semiconductor layer 201, the gate electrode layer 229, and the semiconductor nanowires 205 and 207 to form source contacts 253, drain contacts 255 and gate contacts 257, respectively.

The embodiments of the present disclosure can achieve several technical effects, such as symmetrical stress liners for vertical NW FETs. Devices formed in accordance with embodiments of the present disclosure are useful in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of highly integrated semiconductor devices, particularly for 5 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a doped semiconductor layer on an upper surface of a substrate;
providing a semiconductor nanowire on the doped semiconductor layer;
forming a first stress layer on the doped semiconductor layer surrounding the semiconductor nanowire;
forming a gate electrode layer on a portion of the first stress layer on opposite sides of the semiconductor nanowire;
forming a gate dielectric layer on the first stress layer between the gate electrode layer and the semiconductor nanowire;
forming an oxide layer on a remaining portion of the first stress layer;
forming a second stress layer on the oxide layer, the gate dielectric layer and the gate electrode layer; and
forming contacts to the gate electrode layer, the semiconductor nanowire, and the doped semiconductor layer.

2. The method of claim 1, wherein forming the first stress layer comprises:
providing a hard mask on the semiconductor nanowire;
depositing the first stress layer material over the hard mask, the semiconductor nanowire, and the doped semiconductor layer; and
recessing the first stress layer material to form the first stress layer.

3. The method of claim 1, wherein forming the gate dielectric layer and the gate electrode layer comprises:
depositing a gate dielectric material on the hard mask and side surfaces of the semiconductor nanowire;
depositing a gate electrode material on side and upper surfaces of the gate dielectric material and on the first stress layer;
depositing a sacrificial oxide on side and upper surfaces of the gate electrode material;
planarizing the gate dielectric material, the gate electrode material, and the sacrificial oxide; and
removing the sacrificial oxide and etching the gate electrode material and the gate dielectric material from side surfaces of the semiconductor nanowire to form the gate dielectric layer and the gate electrode layer.

4. The method of claim 3, comprising:
etching by reactive ion etching (RIE) or wet etching.

5. A method of claim 1, wherein forming the second stress layer comprises:
depositing a second stress layer material over the oxide layer, the gate electrode layer, the gate dielectric layer, and the hard mask;
planarizing the second stress layer material and hard mask; and
recessing the second stress layer material to form the second stress layer.

6. A method of claim 1, further comprising:
depositing a sacrificial oxide over the second stress layer and the hard mask;
planarizing the sacrificial oxide and hard mask; and
removing the hard mask, forming a cavity, prior to forming the contacts.

7. A method of claim 6, further comprising:
depositing the sacrificial oxide in the cavity; and
forming vias to the semiconductor nanowire, the gate electrode layer, and the doped semiconductor layer, to form drain, gate, and source contacts, respectively.

8. A method comprising:
providing a doped semiconductor layer on an upper surface of a substrate;
providing semiconductor nanowires on the doped semiconductor layer;
forming a first layer of tensile liner on a first portion of the doped semiconductor layer;
forming a first layer of compressive liner on a second portion of the doped semiconductor layer;
forming a gate electrode layer on a portion of the first layer of tensile liner on opposite sides of a first semiconductor nanowire and the first layer of compressive liner on opposite sides of a second semiconductor nanowire;
forming a gate dielectric layer on the first layer of tensile liner and the first layer of compressive liner between the gate electrode layer and the semiconductor nanowires;
forming an oxide layer on a remaining portions of the first layer of tensile liner and the first layer of compressive liner;
forming a second layer of tensile liner on a first portion of the oxide layer, the gate dielectric layer and the gate electrode layer on opposite sides of the first semiconductor nanowire;
forming a second layer of compressive liner on a second portion of the oxide layer, the gate dielectric layer and the gate electrode layer on opposite sides of the second semiconductor nanowire; and
forming contacts to the doped semiconductor layers, the gate electrode layers, and the semiconductor nanowires.

9. The method of claim 8, wherein forming the first layer of tensile liner comprises:
providing hard masks on the semiconductor nanowires;
depositing the first layer of tensile liner material over the doped semiconductor layer, the hard masks and the semiconductor nanowires; and
recessing the first layer of tensile liner material to form the first layer of tensile liner.

10. The method of claim 8, wherein forming the first layer of compressive liner comprises:
depositing a sacrificial oxide on the first layer of tensile liner, and side surfaces of the hard masks and the semiconductor nanowires;
forming a photoresist on a first portion of the sacrificial oxide and the hard mask;
removing a portion of the sacrificial oxide and the first layer of tensile liner on the second portion of the doped semiconductor layer;
depositing the first layer of compressive liner materials on the second portion of the doped semiconductor layer, side surfaces of the remaining sacrificial oxide, the hard mask and the semiconductor nanowires;
depositing the sacrificial oxide on the first layer of compressive liner materials; and removing a portion of the sacrificial oxide on the second portion of the doped semiconductor layer and a portion of the first layer of compressive liner materials to form the first layer of compressive liner.

11. The method of claim 8, wherein forming the gate dielectric layer and the gate electrode layer comprises:
depositing a gate dielectric material on the hard mask, the first layer of tensile liner, the first layer of compressive liner and side surfaces of the semiconductor nanowires;
depositing a gate electrode material on side and upper surfaces of the gate dielectric material, the first layer of tensile liner and the first layer of compressive liner;
depositing the sacrificial oxide on surfaces of the gate electrode material;
planarizing the gate dielectric material, the gate electrode material, and the sacrificial oxide; and
removing the sacrificial oxide and etching the gate electrode material and the gate dielectric material from side surfaces of the semiconductor nanowires to form the gate dielectric layer and the gate electrode layer.

12. The method of claim 11, comprising:
etching by reactive ion etching (RIE) or wet etching.

13. The method of claim 11, comprising:
removing sidewall portion of the gate electrode layer; and
depositing and recessing sacrificial oxide to form an oxide layer next to the gate electrode layer in the removed sidewall portion of the gate electrode layer.

14. The method of claim 13, wherein forming the second layer of tensile liner and the second layer of compressive liner comprises:
depositing the second layer of compressive liner material over the oxide layer, the gate electrode layer and the gate dielectric layer on opposite sides of the semiconductor nanowires, and side surfaces of the semiconductor nanowires and the hard masks;
depositing the sacrificial oxide on the compressive liner material;
forming a photoresist on the sacrificial oxide, the second layer of compressive liner material and the hard mask on opposite sides of the second semiconductor nanowire;
removing the sacrificial oxide and the second layer of compressive liner material from the surface of the first portion of the gate dielectric, the gate electrode and the oxide layer on opposite sides of the first semiconductor nanowire;
depositing the second layer of tensile liner material on the first portion of the gate dielectric, the gate electrode and the oxide layer on opposite sides of the first semiconductor nanowire;
depositing the sacrificial oxide on the second layer of tensile liner material; and
removing the sacrificial oxide, and recessing the second layer of tensile liner material and the second layer of compressive liner materials to form the second layer of tensile liner and the second layer of compressive liner.

15. The method of claim 14, comprising:
depositing the sacrificial oxide on the second layer of tensile liner and the second layer of compressive liner; and
removing the hard mask, forming a cavity, prior to forming the contacts.

16. The method of claim 15, comprising:
depositing the sacrificial oxide in the cavity; and
forming vias to the doped semiconductor layers, the gate electrode layers, and the semiconductor nanowires to form the source, drain, and gate contacts, respectively.

17. A device comprising:
a doped semiconductor layer on an upper surface of a substrate;
semiconductor nanowires on the doped semiconductor layer;
a first layer of tensile liner on a first portion of the doped semiconductor layer;
a gate electrode layer on a portion of the first layer of tensile liner on opposite sides of a first semiconductor nanowire;
a gate dielectric layer on the first layer of tensile liner between the gate electrode layer and the first semiconductor nanowire;
an oxide layer on a remaining portions of the first layer of tensile liner;
a second layer of tensile liner on a first portion of the oxide layer, the gate dielectric layer and the gate electrode layer on opposite sides of the first semiconductor nanowire.

18. A device of claim 17, comprising:
contacts to the doped semiconductor layer, the gate electrode layer, and the semiconductor nanowire.

19. A device of claim 17, comprising:
a first layer of compressive liner on a second portion of the doped semiconductor layer;
a gate electrode layer on a portion of the first layer of compressive liner on opposite sides of a second semiconductor nanowire;
a gate dielectric layer on the first layer of compressive liner between the gate electrode layer and the second semiconductor nanowire;
an oxide layer on a remaining portions of the first layer of compressive liner; and
a second layer of compressive liner on a second portion of the oxide layer, the gate dielectric layer and the gate electrode layer on opposite sides of the second semiconductor nanowire.

20. A device of claim 19, comprising:
contacts to the doped semiconductor layers, the gate electrode layers, and the semiconductor nanowires.

* * * * *